United States Patent
Zuo et al.

(10) Patent No.: US 8,199,464 B2
(45) Date of Patent: Jun. 12, 2012

(54) COVER MECHANISM AND ELECTRONIC DEVICE USING SAME

(75) Inventors: Zhou-Quan Zuo, Shenzhen (CN); Hong Wu, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 315 days.

(21) Appl. No.: 12/568,796

(22) Filed: Sep. 29, 2009

(65) Prior Publication Data

US 2010/0309613 A1    Dec. 9, 2010

(30) Foreign Application Priority Data

Jun. 8, 2009    (CN) .......................... 2009 1 0303051

(51) Int. Cl.
*G06F 1/16* (2006.01)
*H01R 13/44* (2006.01)
*H01H 9/04* (2006.01)

(52) U.S. Cl. .............. 361/679.01; 361/679.55; 439/135; 439/136; 200/302.1

(58) Field of Classification Search ............ 361/679.01–679.45, 679.55–679.59; 439/135–139; 200/302.1; 292/1, 57

See application file for complete search history.

(56) References Cited

U.S. PATENT DOCUMENTS

| | | | | |
|---|---|---|---|---|
| 4,640,575 A * | 2/1987 | Dumas | .......................... | 385/134 |
| 6,409,042 B1 * | 6/2002 | Hirano et al. | .................. | 220/812 |
| 6,991,490 B1 * | 1/2006 | Su | ................................ | 439/521 |
| 7,083,439 B1 * | 8/2006 | Hayakawa et al. | ........... | 439/136 |
| 7,189,084 B2 * | 3/2007 | Iikura | ............................ | 439/135 |
| 7,572,993 B2 * | 8/2009 | Chen et al. | .................. | 200/302.1 |
| 2002/0119697 A1 * | 8/2002 | Chan | .............................. | 439/519 |
| 2006/0154520 A1 * | 7/2006 | Gennai et al. | ................. | 439/578 |
| 2009/0270144 A1 * | 10/2009 | Yang et al. | .................. | 455/575.3 |

* cited by examiner

*Primary Examiner* — Jayprakash N Gandhi
*Assistant Examiner* — Nidhi Desai
(74) *Attorney, Agent, or Firm* — Altis Law Group, Inc.

(57) ABSTRACT

A cover mechanism is for an electronic device, and the cover mechanism includes a base member and a cover member. The base member defines a hole and a receiving groove. The cover member is received in the receiving groove. The cover member includes a connecting portion to allow the cover member to be elastically bent to cover the hole.

5 Claims, 5 Drawing Sheets

COVER MECHANISM AND ELECTRONIC DEVICE USING SAME

BACKGROUND

1. Technical Field

The present disclosure relates to cover mechanisms used in electronic devices (e.g., mobile phones).

2. Description of Related Art

Electronic devices usually have external interfaces (e.g., universal serial bus (USB)) for electrically connecting peripheral devices (e.g., printers), accessories (e.g., USB flash drives) or other electronic devices. Such external interfaces should be protected by cover mechanisms from e.g., dust or water, to maintain proper functioning.

The cover mechanisms usually include covers with locks. The covers are typically locked to the electronic devices by latches to cover the area through which the interfaces of electronic devices are exposed. However, the covers are often not permanently attached to the electronic device. Thus, the covers may easily be misplaced or lost when not locked to the electronic devices.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present cover mechanism. Moreover, in the drawings, like reference numerals designate corresponding parts throughout the several views, in which.

DETAILED DESCRIPTION

Figure 1:
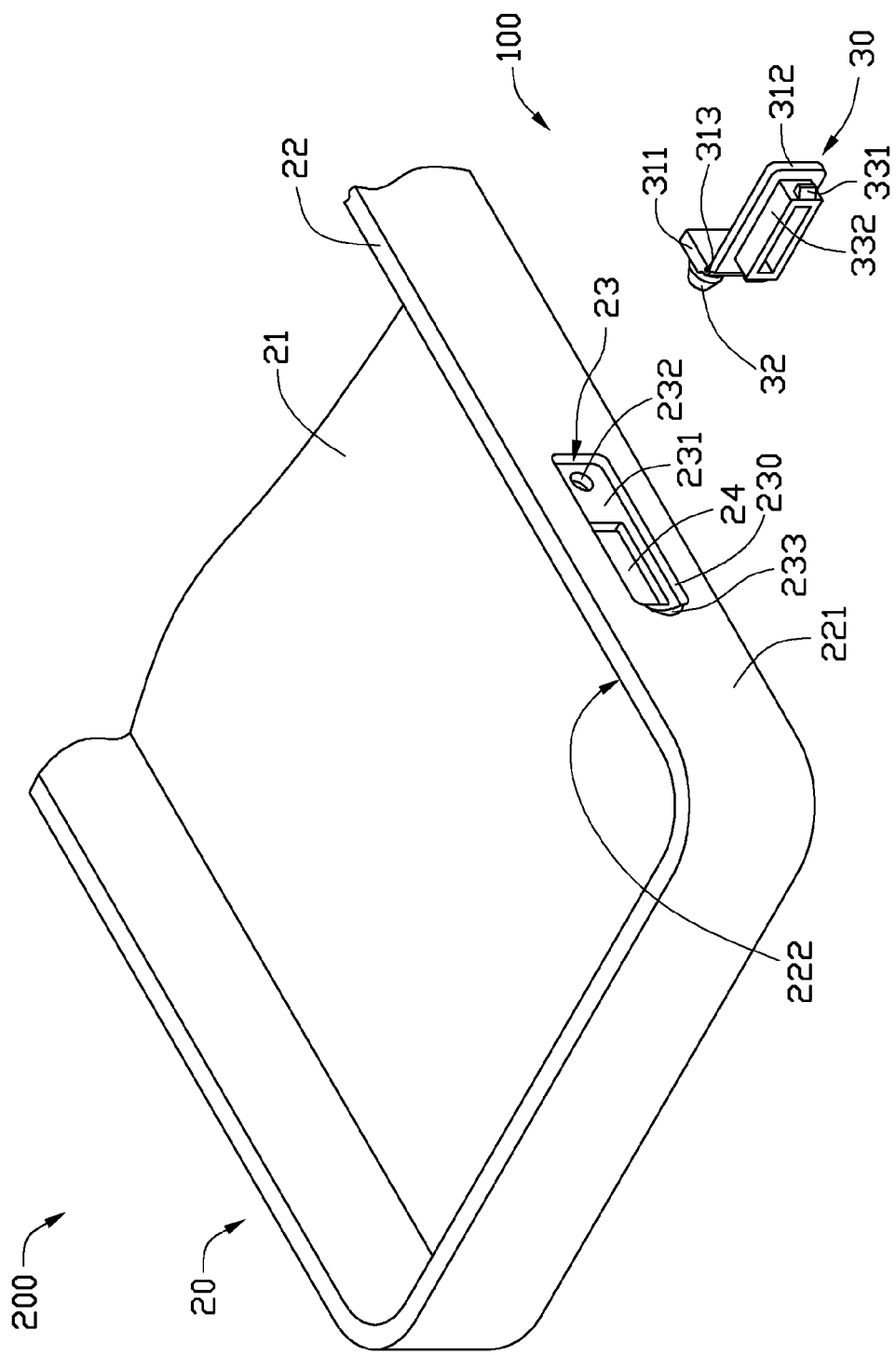
FIG. 1 is an exploded, isometric view of an exemplary cover mechanism used in an electronic device.

FIG. 1 shows an exemplary embodiment of a cover mechanism 100 used to an electronic device 200, such as a mobile phone.

The cover mechanism 100 includes a base member 20 and a cover member 30. The base member 20 may be portions of the electronic device 200 and includes a bottom wall 21 and a sidewall 22 perpendicular to the bottom wall 21. The sidewall 22 includes an outer surface 221 and an inner surface 222. The outer surface 221 of the sidewall 22 includes a receiving groove 23 defined by four side surfaces 230 and a bottom surface 231. The bottom surface 231 defines a hole 24 and a pin hole 232. The pin hole 232 is positioned at one end of the bottom surface 231, and communicates with the inner surface 222. The hole 24 extends through the inner surface 222, and communicates with the receiving groove 23. In this embodiment, the hole 24 is a connector interface hole. The outer surface 221 adjacent to one of the side surfaces 230 defines an arucate cutout 233 for conveniently operating the cover member 30.

Figure 2:
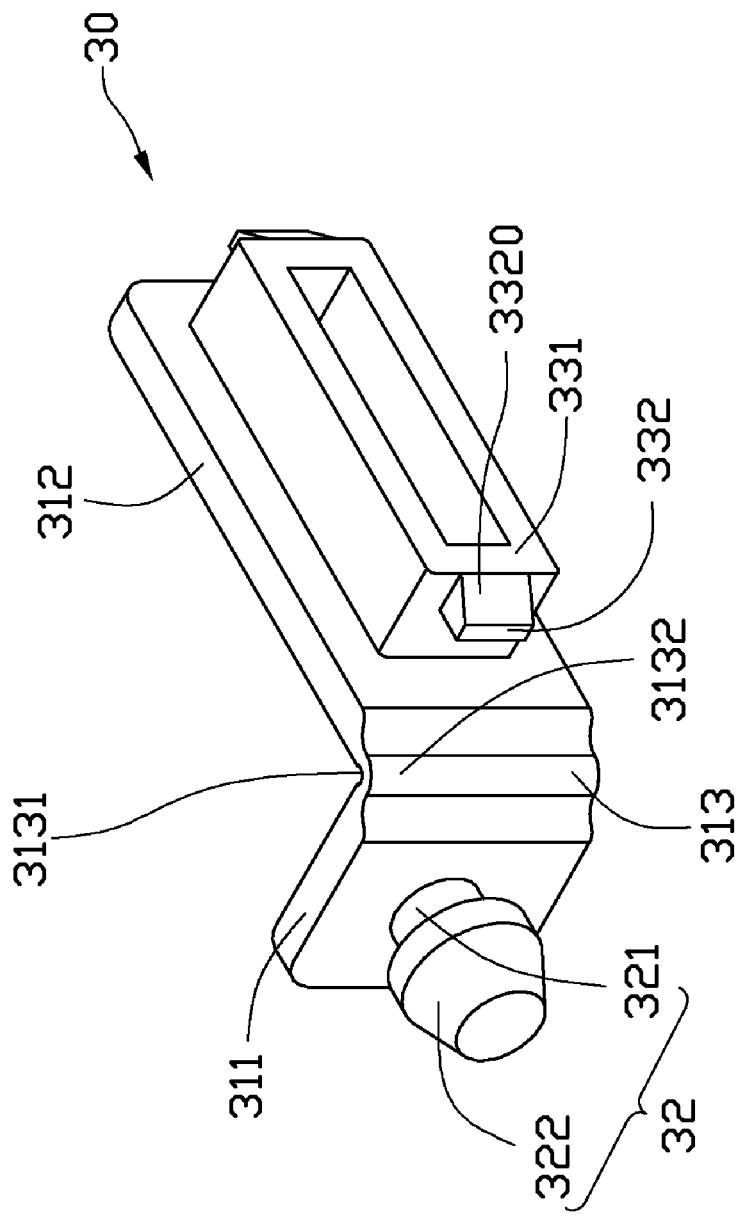
FIG. 2 is an enlarged view of a cover member of the cover mechanism shown in FIG. 1.

The cover member 30 may be received in the receiving groove 23 of the base member 20 and cover the hole 24. The cover member 30 is made of flexible and elastic material such as rubber and soft plastics. Referring to FIG. 2, the cover member 30 includes a fixed portion 311, a cover portion 312 and a connecting portion 313 integrally formed together. The fixed portion 311 forms a pin 32 at one side thereof. The pin 32 includes a cylindrical portion 321 and a frustum portion 322 integrally formed together. A size of the cylindrical portion 321 corresponds to that of the pin hole 232 allowing the cylindrical portion 321 to pass through the pin hole 232. The frustum portion 322 may deformedly pass through the pin hole 232, and latch to the inner surface 222 of the sidewall 22. The cover portion 312 is substantially perpendicular to the fixed portion 311 at an original state. The cover portion 312 includes a filler block 331 and two latching blocks 332. The filler block 331 is substantially frame, and is configured for being inserted into the hole 24. The latching blocks 332 are respectively formed at two sides of the filler block 331. Each latching block 332 has a wedge surface 3320 configured to slide through the hole 24. The connecting portion 313 has a large elasticity allowing the cover portion 312 to bend relative to the fixed portion 311. In order to strengthen the elasticity of the connecting portion 313, one side of the connecting portion 313 defines a slit 3131, the other side of the connecting portion 313 defines a recess 3132.

Figure 3:
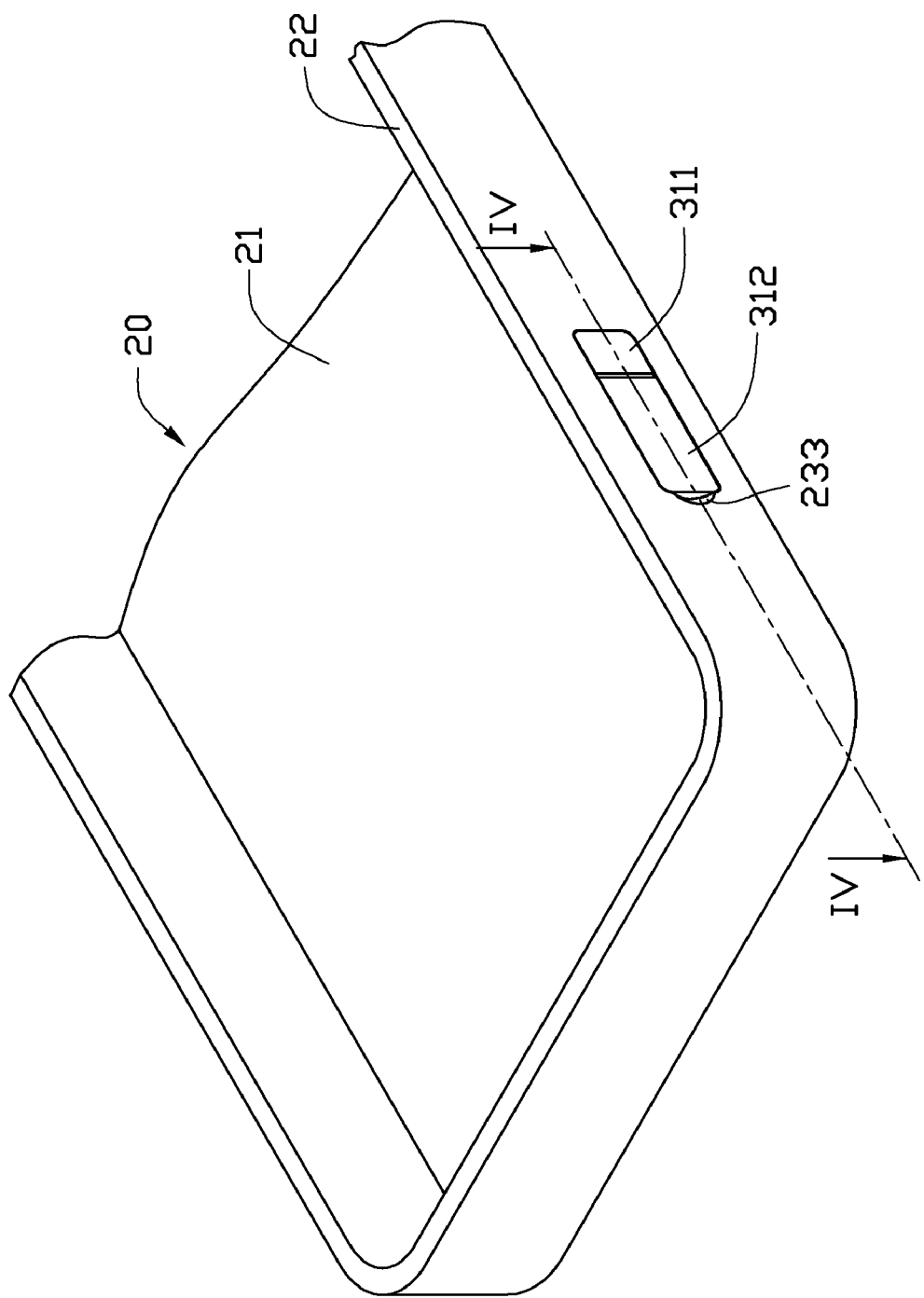
FIG. 3 is an assembled, isometric view of the exemplary cover mechanism shown in FIG. 1.
Figure 4:
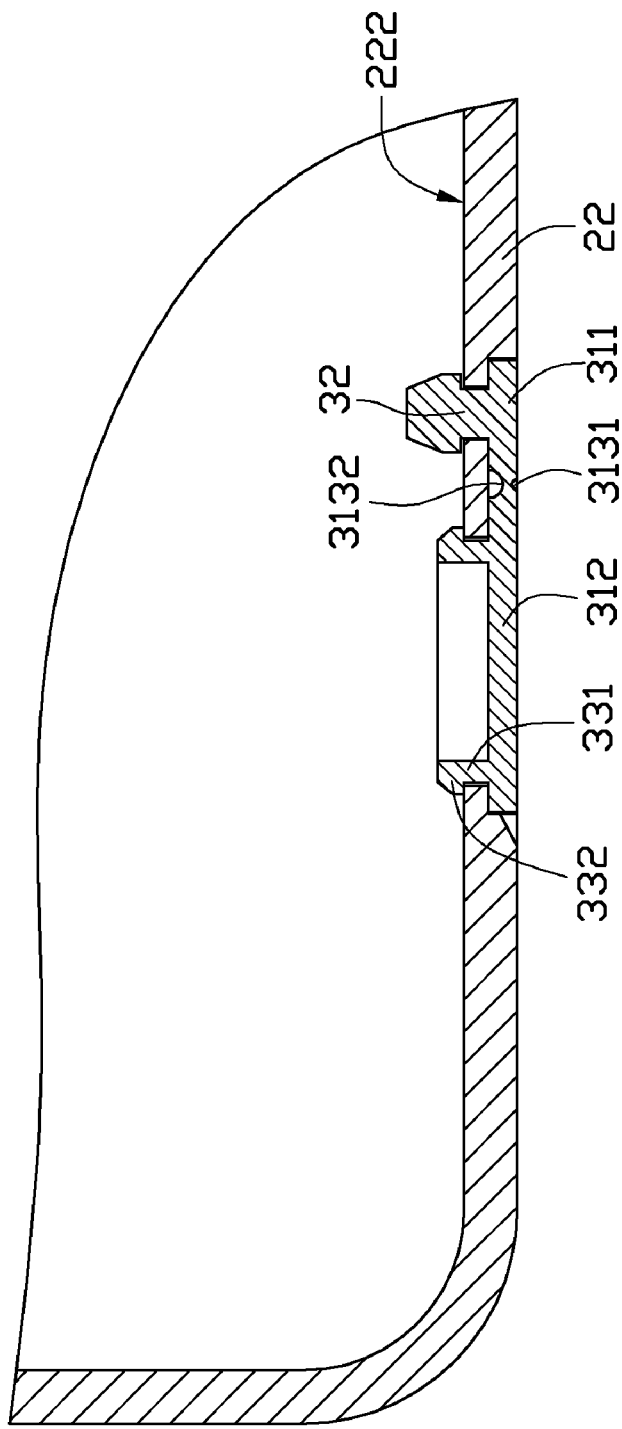
FIG. 4 is a cross sectional view of the cover mechanism shown in FIG. 3 taken along line IV-IV.

In FIGS. 3 and 4, when the cover member 30 is assembled to the base member 20, firstly, the pin 32 of the cover member 30 is aligned with the pin hole 232 of the base member 20, and is then pressed into the pin hole 232. The frustum portion 322 deformedly passes through the pin hole 232 and latches the sidewall 22 of the base member 20 for fixing the cover member 30 to the base member 30. In order to cover the hole 24, the cover portion 312 is bent along the connection portion 313. The connecting portion 313 deforms and accumulates elastic energy until the cover portion 312 is co-planner with the fixed portion 311. The filler block 331 is inserted into the hole 24. Two latching blocks 332 slide through the hole 24 and latch the sidewall 22. Thus, the cover member 30 is completely received in the receiving groove 23, and covers the hole 24. One end of the cover portion 312 is adjacent to the cutout 233.

Figure 5:
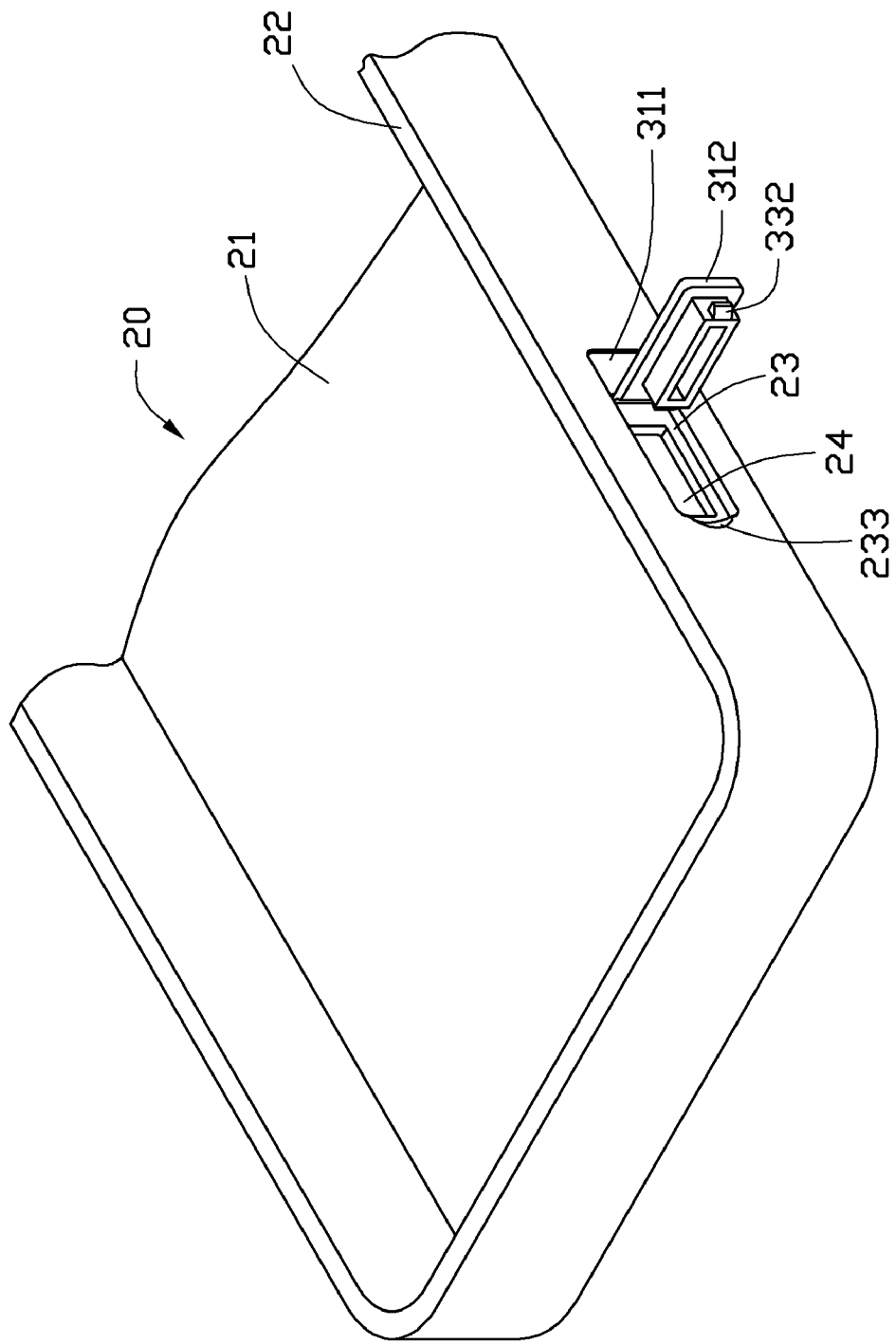
FIG. 5 is similar to FIG. 3, but in an opened position of the cover mechanism.

Referring to FIG. 5, when the cover member 30 is opened, the operator may hold the cover portion 312 from the cutout 233 to turn the cover member 30. After the filler block 33 and the latching blocks 332 are separated from the hole 24, the accumulated elastic energy of the connection portion 313 is released to rebound the cover portion 312. Therefore, the hole 24 is exposed from the base member 20 for insertion of one of various kinds of plugs.

To close and lock the cover mechanism 100, the above process is reversed and the cover member 30 moved from the opened position to the closed position. The closing process ends when the cover portion 312 latches the sidewall 22.

It is understood that the cover portion 312 is connected with the fixed portion 311 at a suitable angle at an original state. In addition, only the connecting portion 312 of the cover member 30 is made of elastic material for allowing the cover portion 312 to be bent relative to the fixed portion 311.

It is to be understood, however, that even through numerous characteristics and advantages of the exemplary invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cover mechanism for an electronic device, the cover mechanism comprising: a base member defining a hole and a receiving groove; a cover member being substantially planar and received in the receiving groove, the cover member including a fixed portion, a cover portion and a connecting portion integrally formed together, the connecting portion being thinner than both the fixed and cover portions, along their respective planes; wherein when the cover portion is bent along the thinner connection portion, the thinner connecting portion deforms and accumulates elastic energy, the cover portion covers the hole, and is co-planer with the fixed portion in a first state; when the cover portion is completely separate from the hole, the thinner connecting portion causes the cover portion to automatically rebound to be substantially perpendicular to the fixed portion and exposes the hole in a second state; wherein the fixed portion forms a pin at one side thereof, the pin includes a cylindrical portion and a frustum portion integrally formed together, the base member defines a pin hole, the frustum portion deformedly pass through the pin hole; and wherein the cover portion includes a filler block and two latching blocks, the latching blocks are respectively formed at two sides of the filler block, the filler block plugs the hole to seal the hole.

2. The cover mechanism as claimed in claim 1, wherein one side of the connecting portion defines a slit, the other side of the connecting portion defines a recess for strengthening an elastic force of the connecting portion.

3. An electronic device, comprising: a housing; a cover mechanism, comprising: a base member being a portion of the housing, the base member including a sidewall with an inner surface and an outer surface, the sidewall defining a hole; and a cover member including a fixed portion, a cover portion and a connecting portion integrally formed together, the connecting portion being thinner than both the fixed and cover portions, along their respective planes; wherein when the cover portion is bent along the thinner connection portion, the thinner connecting portion deforms and accumulates elastic energy, the cover portion covers the hole, and is co-planer with the fixed portion in a first state; when the cover portion is completely separate from the hole, the thinner connecting portion causes the cover portion to automatically rebound to be substantially perpendicular to the fixed portion and exposes the hole in a second state; wherein the fixed portion forms a in at one side thereof, the in includes a cylindrical portion and a frustum portion integrally formed together, the base member defines a pin hole, the frustum portion deformedly pass through the pin hole; and wherein the cover portion includes a filler block and two latching blocks, the latching blocks are respectively formed at two sides of the filler block, the filler block plugs the hole to seal the hole.

4. The electronic device as claimed in claim 3, wherein the outer surface defines an arcuate cutout for operating the cover member.

5. The electronic device as claimed in claim 3, wherein the hole is a connector interface hole, the filler block is substantially a frame, the latching blocks are respectively latched on the inner surface.

* * * * *